US007436327B2

(12) United States Patent
Kaski

(10) Patent No.: US 7,436,327 B2
(45) Date of Patent: Oct. 14, 2008

(54) CAPACITIVE RELAY TAKEOFF SWIMMING PLATFORM SENSOR SYSTEM

(75) Inventor: Kurt R. Kaski, Lake Norden, SD (US)

(73) Assignee: Daktronics, Inc., Brookings, SD (US)

( * ) Notice: Subject to any disclaimer, the term of this patent is extended or adjusted under 35 U.S.C. 154(b) by 740 days.

(21) Appl. No.: 10/750,639

(22) Filed: Dec. 22, 2003

(65) Prior Publication Data

US 2005/0135193 A1 Jun. 23, 2005

(51) Int. Cl.
*H03M 11/00* (2006.01)

(52) U.S. Cl. .......................... 341/33; 341/20; 307/116; 307/119; 340/545.4; 340/323 R; 377/15; 200/52 R; 200/600

(58) Field of Classification Search .................. 341/20, 341/33; 307/116, 119; 340/530, 545.4, 323 R; 200/52 R, 600; 377/15
See application file for complete search history.

(56) References Cited

U.S. PATENT DOCUMENTS

| | | | | | |
|---|---|---|---|---|---|
| 3,916,214 | A | * | 10/1975 | Coble et al. | 307/119 |
| 3,944,763 | A | * | 3/1976 | Beierwaltes | 200/52 R |
| 4,292,696 | A | * | 10/1981 | Berger | 4/505 |
| 4,394,643 | A | * | 7/1983 | Williams | 341/33 |
| 6,225,711 | B1 | * | 5/2001 | Gupta et al. | 307/125 |
| 6,713,897 | B2 | * | 3/2004 | Caldwell | 307/125 |
| 7,030,513 | B2 | * | 4/2006 | Caldwell | 307/116 |
| 7,119,799 | B2 | * | 10/2006 | Kaski | 345/173 |
| 2004/0104826 | A1 | * | 6/2004 | Philipp | 341/34 |

* cited by examiner

*Primary Examiner*—Albert K Wong
(74) *Attorney, Agent, or Firm*—Hugh D. Jaeger

(57) ABSTRACT

A capacitive relay takeoff swimming platform sensor system including multiple stations, timing devices and capacitive sensor devices where the presence or departure of a second swimmer on a relay takeoff swimming platform is sensed by the change in a capacitive field above a sensing mat and compared to the arrival of a first swimmer at a touchpad sensor.

44 Claims, 9 Drawing Sheets

CAPACITIVE RELAY TAKEOFF SWIMMING PLATFORM SENSOR SYSTEM

CROSS REFERENCES TO RELATED APPLICATIONS

None.

BACKGROUND OF THE INVENTION

1. Field of the Invention

The present invention is for a swimming event timing device, and more particularly, pertains to a capacitive relay takeoff swimming platform sensor system.

2. Description of the Prior Art

Various sensing and measuring devices and schemes have been incorporated during relay swimming events where a first relay swimmer is required to contact a touchpad sensor at the edge of a swimming pool adjacent to a second relay swimmer who then is allowed to depart in the relay sequence from a relay takeoff swimming platform (also referred to as a starting platform). Departure from the relay takeoff swimming platform is dependent on observations and timing skills of the second relay swimmer who, undesirably, may leave the starting platform prior to the touching of the touchpad sensor by the first relay swimmer. Premature departure of the second relay swimmer from the relay takeoff swimming platform can be cause for disqualification; and the International Amateur Swimming Federation (FINA) contemplates such by FINA Rule SW 10.10 which states: "In relay events, the team of a swimmer whose feet lose touch with the starting platform before the preceding teammate touches the wall shall be disqualified, unless the swimmer in default returns to the original starting point at the wall, but it shall not be necessary to return to the starting platform." This rule pertains to relay exchanges in a relay event, and is different from the rule for the start of a race, which states that any movement before the start will disqualify the competitor. In a relay exchange, the second swimmer on the relay takeoff swimming platform can legally be completely horizontal with one toe touching the relay takeoff swimming platform when the first swimmer in the water touches the touchpad sensor on the wall.

In current practice it is difficult for an electronic timing system to detect the actual instant the second swimmer loses all contact with the relay takeoff swimming platform. Currently available relay takeoff sensors rely on measuring the force exerted by the second swimmer on the relay takeoff swimming platform, some using a mechanical switch mechanism in the relay takeoff swimming platform top, others using a pressure sensitive piezo device. Experiments have been conducted with this latter method using load cells and accelerometers. It has been demonstrated that the accuracy of force measurement methods is limited by the fact that the swimmer may have one toe in contact with the relay takeoff swimming platform, but exert an unmeasurable force against it. This results in the start being signaled before it has actually occurred. Because of this, FINA allows a tolerance of 0.03 second in relay exchange timing. In other words, a swimmer will not be disqualified unless the timing system shows a departure more than 0.03 second before the swimmer in the water touches the touchpad sensor. The "0.03 second" figure was established in tests using an Omega Sports Timing starting block, which showed that the signal from the relay takeoff swimming platform was consistently between 0.024 and 0.027 second before the actual departure.

What is needed is a system which will give an accurate measurement of the relay exchange time and which can sense contact between the second swimmer and the relay takeoff swimming platform without regard to force. Such a system is provided by the inventor by incorporating capacitive touch sensing technology. More specifically, a sensing mat, including onboard sensing circuitry, senses a capacitive field, and the change in the capacitive field generated by the second swimmer is used to derive accurate swim relay sensing and timing information within desired and approved parameters.

SUMMARY OF THE INVENTION

The general purpose of the present invention is to provide a capacitive relay takeoff swimming platform sensor system.

According to the present invention the system can include multiple like components stationed and arranged along and at the ends of multiple swimming pool lanes used for timing of relay swimming events. The capacitive relay takeoff swimming platform sensor system is incorporated at least at one swimming lane station, but preferably at all swimming lane stations, each swimming lane station having a relay takeoff swimming platform (starting platform) the components of which include a sensing mat and a closely located sensor circuit in a housing which are a part of the relay takeoff swimming platform, a cable connecting the sensor circuit to a lane module, and a touchpad and touchpad sensor mounted on the swimming pool at the lane end being connected to the lane module by a cable. The lane modules at each swimming lane station are connected by cables to a timer and start system for conducting starts and finishes at each swimming lane station and for analyzing data at the relay takeoff swimming platforms with respect to the arrivals of first relay swimmers at the pool edges and the departures of second relay swimmers at the relay takeoff swimming platforms. A scoreboard is also connected as part of the system to annunciate swimming event elapsed times or other data as desired.

The arrival of the first relay swimmer is sensed by contact with the touchpad sensor mounted on the associated swimming pool lane end, and the departure of the second relay swimmer from the relay takeoff swimming platform is sensed by the sensing mat. Departure of the second relay swimmer from the relay takeoff swimming platform is detected by a change of the capacitance level around and about the upper regions of the sensing mat at the outboard end of the relay takeoff swimming platform when the second relay swimmer influences the capacitance level by departure from the relay takeoff swimming platform. An integrated circuit incorporated with adjoining circuitry is contained in a housing mounted adjacent to one edge of the sensing mat to sense the capacitance level and the influence thereof adjoining the upper region of the sensing mat. The sensing mat is constructed of multiple layers, where being protective layers, some being electrically insulative layers, and some being electrically conductive layers which are opposed and form sensor or other purpose electrodes. The sensor electrode is incorporated to monitor the capacitance of the region at the upper region of the sensing mat. When the monitored capacitance is increased/decreased by the departure of the second relay swimmer from the relay takeoff swimming platform, such capacitance change is detected by the integrated circuit to denote and relay the departure of the second relay swimmer whereupon circuitry electronically simulates the closure of a switch for comparison of the departure time of the second relay swimmer to the arrival time of the first relay swimmer by the connected timer.

According to one or more embodiments of the present invention, there is provided a capacitive relay takeoff swimming platform sensor system.

One significant aspect and feature of the present invention is a capacitive relay takeoff swimming platform sensor system which times a relay swimming event from start to finish.

Another significant aspect and feature of the present invention is a capacitive relay takeoff swimming platform sensor system which compares the arrival time of a first relay swimmer to the departure time of a second relay swimmer during a relay event.

Still another significant aspect and feature of the present invention is a capacitive relay takeoff swimming platform sensor system where the presence of a relay swimmer on or the absence of a relay swimmer from a relay takeoff swimming platform is detected.

Yet another significant aspect and feature of the present invention is a capacitive relay takeoff swimming platform sensor system where detection of the presence of a relay swimmer on or the absence of a relay swimmer from a takeoff swimming platform is accomplished by monitoring of a capacitive field.

Having thus mentioned certain significant aspects and features of the present invention, it is the principal object of the present invention to provide a capacitive relay takeoff swimming platform sensor system.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
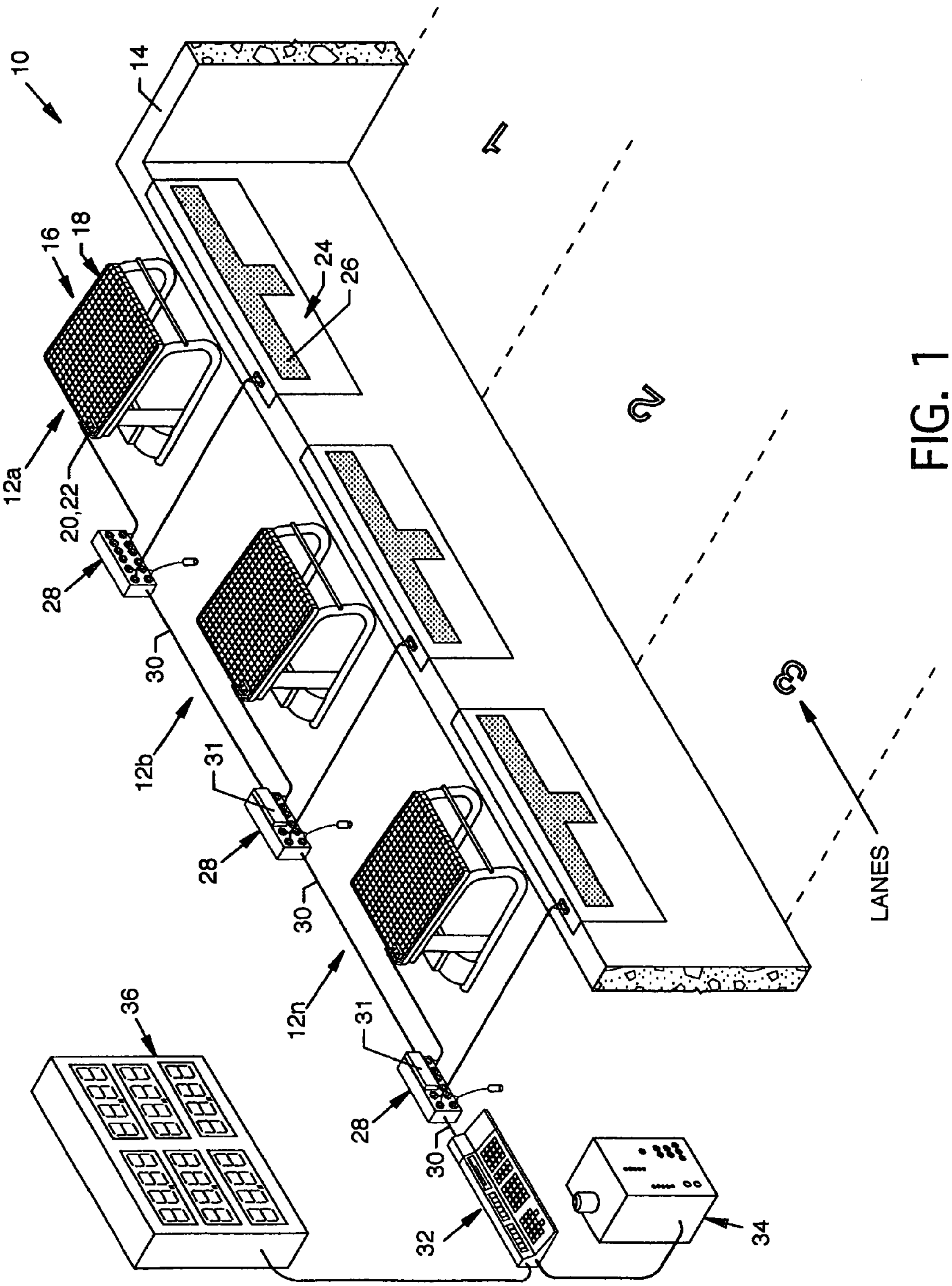
FIG. 1 is an isometric view of a capacitive relay takeoff swimming platform sensor system, the present invention, shown in conjunction with and located at or near the end of a plurality of swimming lane stations in a swimming pool.
Figure 6A:
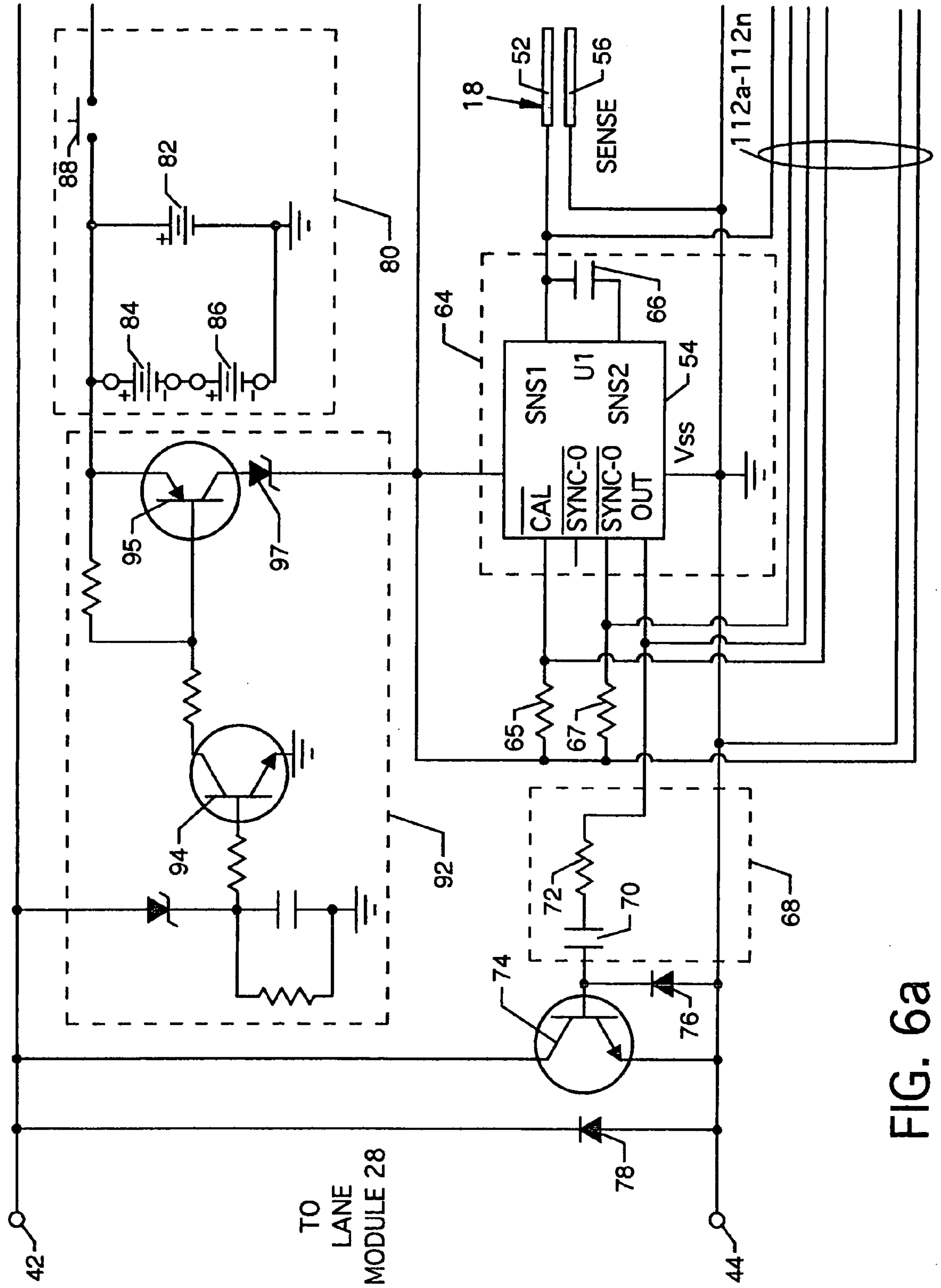
FIGS. 6*a* and 6*b*, when aligned as shown by FIG. 5, illustrate the sensor circuit schematic diagram for the sensor circuit.
Figure 6B:
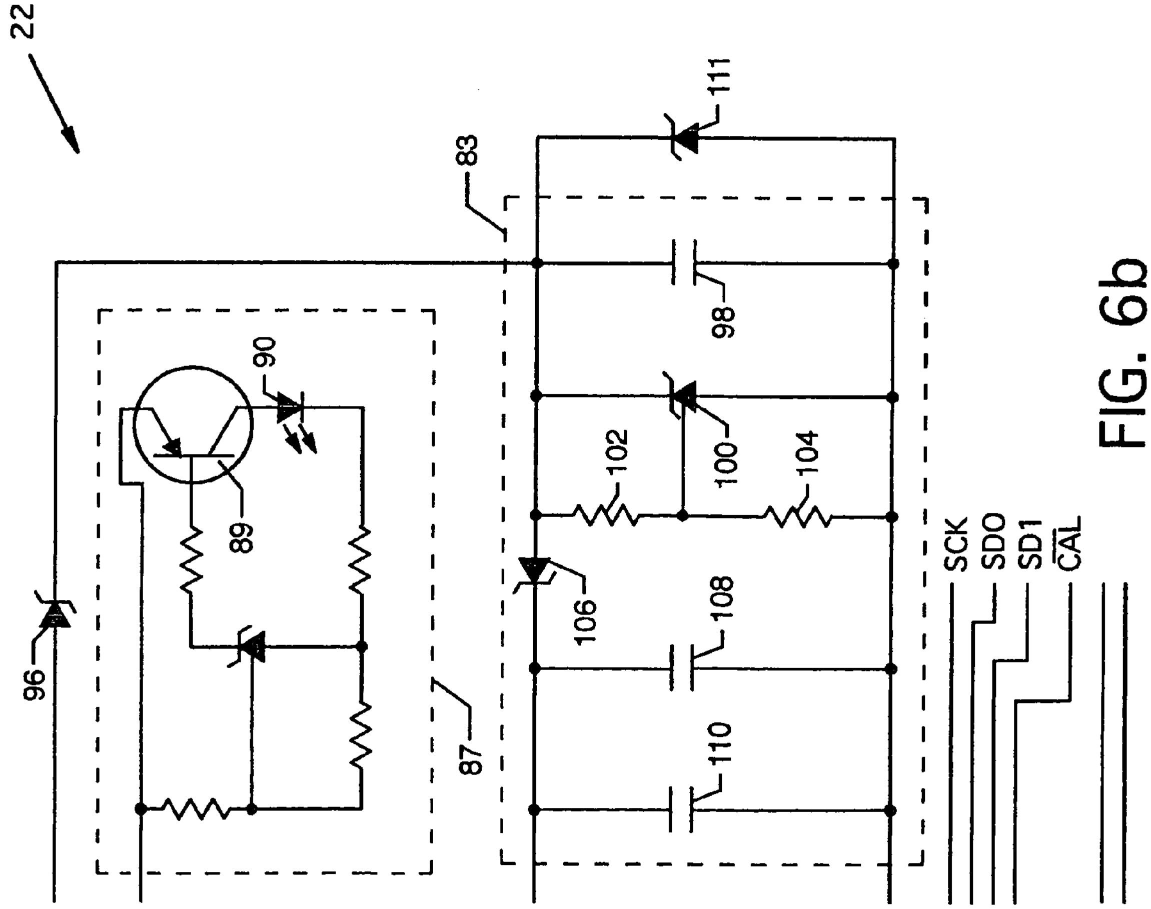

FIG. 1 is an isometric view of a capacitive relay takeoff swimming platform sensor system 10, the present invention, shown in conjunction with and located at or near the end of a plurality of swimming lane stations 12*a*-12*n* in a swimming pool 14 where each of the swimming lane stations 12*a*-12*n* is similar in design and construction and has a commonality of components. The swimming lane station 12*a* includes a relay takeoff swimming platform 16 the components of which include a sensing mat 18 and a closely located housing 20 surrounding a sensor circuit 22 (FIGS. 6*a*-6*b*). A touchpad 24, having a touchpad sensor 26 the operation of which is disclosed in U.S. Pat. No. 6,156,987 by the same inventor, is located at one end of the swimming pool lane 1 to signal arrival of a swimmer for timing signal purposes. A lane module 28 connects to the sensor circuit 22 on the relay takeoff swimming platform 16 and to the touchpad 24. As illustrated, multiple lane modules 28 are connected at their respective swimming lane stations 12*a*-12*n* and are interconnected by cables 30 and plugs 31 to each other and to a timer 32. A plug 31 also connects cable 30 to the rear of the timer 32 (not shown). A start system 34, which can include visual and aural starting devices, is connected to the timer 32. A scoreboard 36 is also included being connected to the timer 32.

Figure 2:
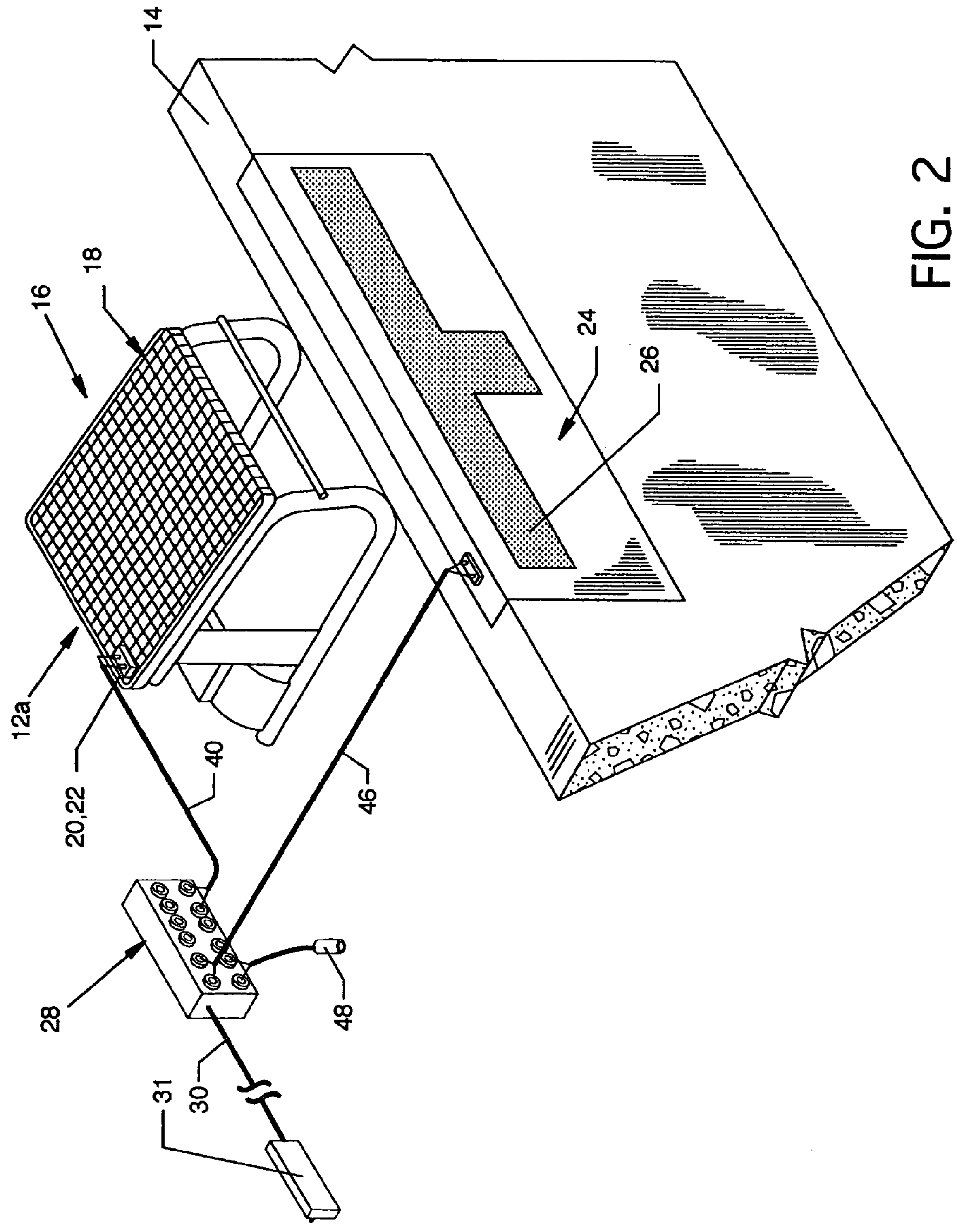
FIG. 2 is an isometric view of a swimming lane station located at one end of the swimming pool showing the connection of the sensing mat and the sensor circuit to a lane module.

FIG. 2 is an isometric view of the swimming lane station 12*a* located at one end of the swimming pool 14 showing the connection of the sensing mat 18 and the sensor circuit 22 to a lane module 28. Suitable electrical connectors, such as banana plugs 38, at one end of a cable 40 engage other suitable electrical connectors, such as jacks 42 and 44 (FIG. 3), located at the housing 20 to connect the sensor circuit 22 to the lane module 28. Suitable connectors at the ends of a cable 46 are also provided to electrically attach the touchpad sensor 26 of the touchpad 24 to the lane module 28. The lane module 28 can include one or more corded control buttons 48 for use by swimming judges to manually input event time references into the lane module 28.

Figure 3:
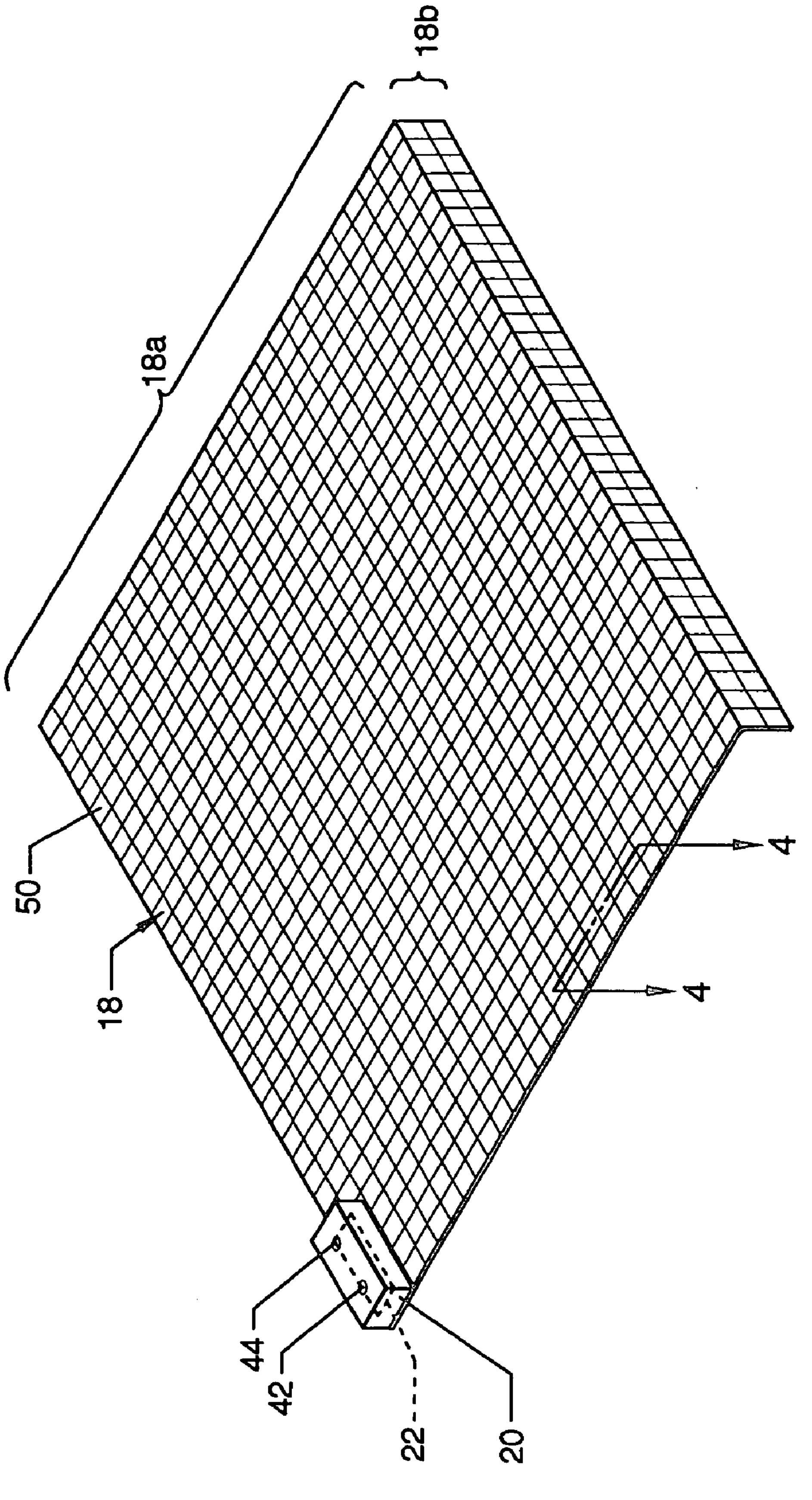
FIG. 3 is an isometric view of the sensing mat and the housing including the sensor circuit and jacks.

FIG. 3 is an isometric top view of the sensing mat 18 and the housing 20 including the sensor circuit 22 and the jacks 42 and 44 which receive the banana plugs 38 for electrical connection of the output of the sensor circuit 22 to the lane module 28 via the cable 40. The sensing mat 18 which is layered and is part of the relay takeoff swimming platform 16, includes a horizontally oriented portion 18*a* which aligns along and about the horizontally oriented planar end of the relay takeoff swimming platform 16 overlying the swimming pool 14 for adequate and controlled physical and capacitive contact with all or a major portion of a dry or wet swimmer's feet and a vertically oriented portion 18*b* which is contiguous and continuous with and extends downwardly from the horizontally oriented portion 18*a* for adequate and controlled physical and capacitive contact of a portion of a swimmer's wet or dry feet and/or toes, as required. The outer surface of the sensing mat 18 includes an electrically conductive exterior layer 50 textured or otherwise formed to enhance suitable non-slip contact with the dry or wet feet and/or toes or portions thereof of a swimmer.

Figure 4:
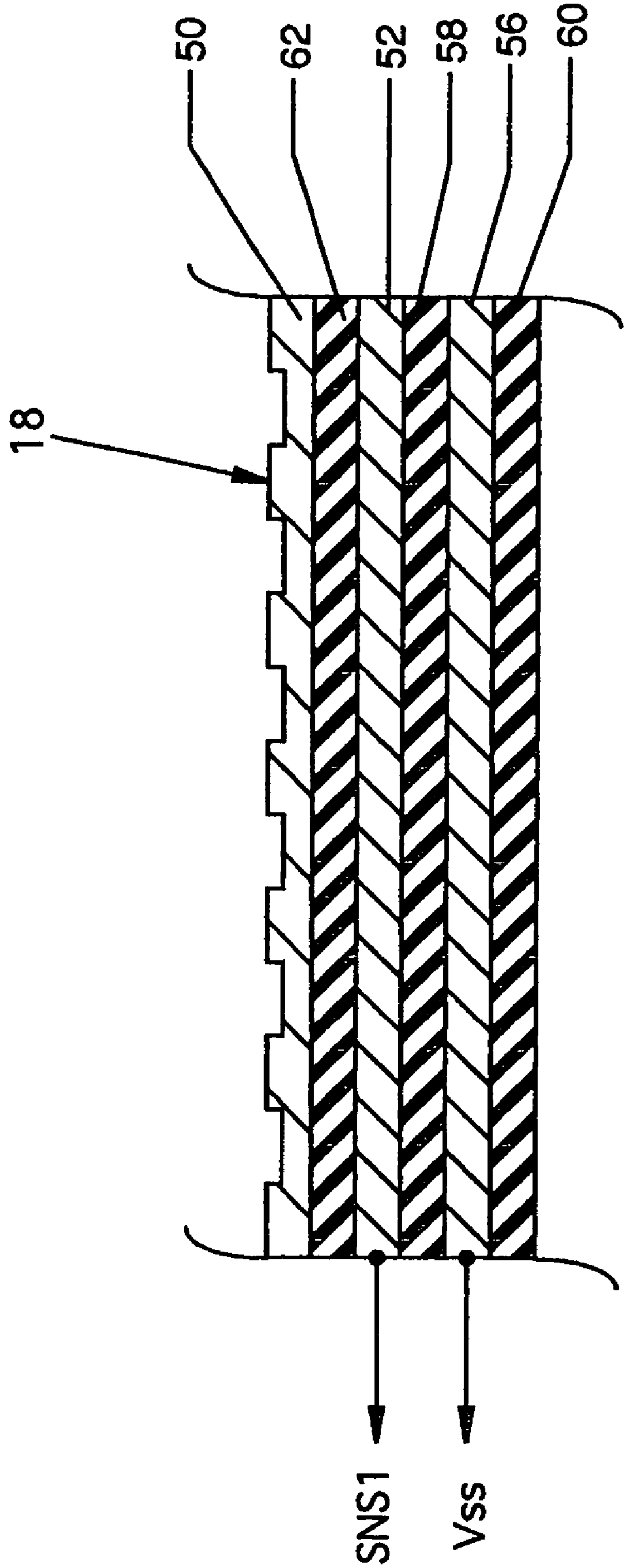
FIG. 4 is an enlarged cross section view of the sensing mat along line 4-4 of FIG. 3 showing the layered construction including alternating electrical conductor and electrical insulator layers.

FIG. 4 is an enlarged cross section view of the sensing mat 18 along line 4-4 of FIG. 3 showing the layered construction including alternating electrical conductor, electrode, and electrical insulator layers suitably fashioned where a suitable adhesive or other bonding means is incorporated (not shown) to bond the conductor, electrode and insulator layers together substantially into a structure which maintains integrity and suitable electrical and physical qualities even when not assuming an entirely planar shape. The sensing mat 18 electrically connects to the sensor circuit 22 incorporating a charge-transfer touch integrated circuit 54 (FIGS. 6*a*-6*b*) which fosters projection of a capacitive sense field around a conductive sense electrode 52 central to the sensing mat 18. The charge-transfer touch integrated circuit 54 can be a QT310™ capacitive sensor integrated circuit (IC) (from QUANTUM RESEARCH GROUP®) utilizing a proprietary charge transfer sensing algorithm. Disruption or change of the capacitive sense field about the conductive sense electrode 52 connected to the SNS1 terminal of the charge-transfer touch integrated circuit 54 in the sensor circuit 22 is detected to signal swimmer departure. The behavior of the capacitive sense field about the sensing mat 18 is influenced by the conductive exterior layer 50 to evenly distribute the capacitive sense field projected by the conductive sense electrode 52 for uniform sensing and to diminish the capacitive sense field to ensure that the conductive sense electrode 52 will be sensitive to touch and not mere proximity. A conductive ground electrode 56 opposes the conductive sense electrode 52 with an insulator layer 58 disposed therebetween. The conductive ground electrode 56 in opposition to the conductive sense electrode 52 increases the overall capacitance across the sensing mat 18 to ensure a suitable response time as well as to shield the conductive sense electrode 52 from sensing nuisance touches in the underside region of the relay takeoff swimming platform 16. The conductive ground electrode 56 connects to the ground (Vss) of the sensor circuit 22. An insulator layer 60 is included on the underside of the conductive ground electrode 56 to insulate the conductive ground electrode 56 from a mounting surface such as provided by the relay takeoff swimming platform 16. Another insulator layer 62 is provided between the conductive sense electrode 52 and the conductive exterior layer 50 to insulate the conductive sense electrode 52 from the conductive exterior layer 50 as well as to provide protection of the conductive sense electrode 52. In the alternative, composite material can be incorporated into use in lieu of the conductive sense electrode 52, the insulator layer 58, and the conductive ground electrode 56, such as ACM (aluminum composite material), such as ALUCOBOND®. ACM includes a top layer of aluminum, a bottom layer of aluminum, and a polyethylene layer affixed therebetween forming a laminate. The top layer of aluminum corresponds to the conductive sense electrode 52, the polyethylene layer corresponds to the insulator layer 58, the bottom aluminum layer corresponds to the conductive ground electrode 56, and, if incorporated, a layer of paint applied to the upper surface of the top layer of aluminum corresponds to the insulator layer 62. The use of such a pre-formed laminate is beneficial in decreasing fabrication time.

Figure 5:
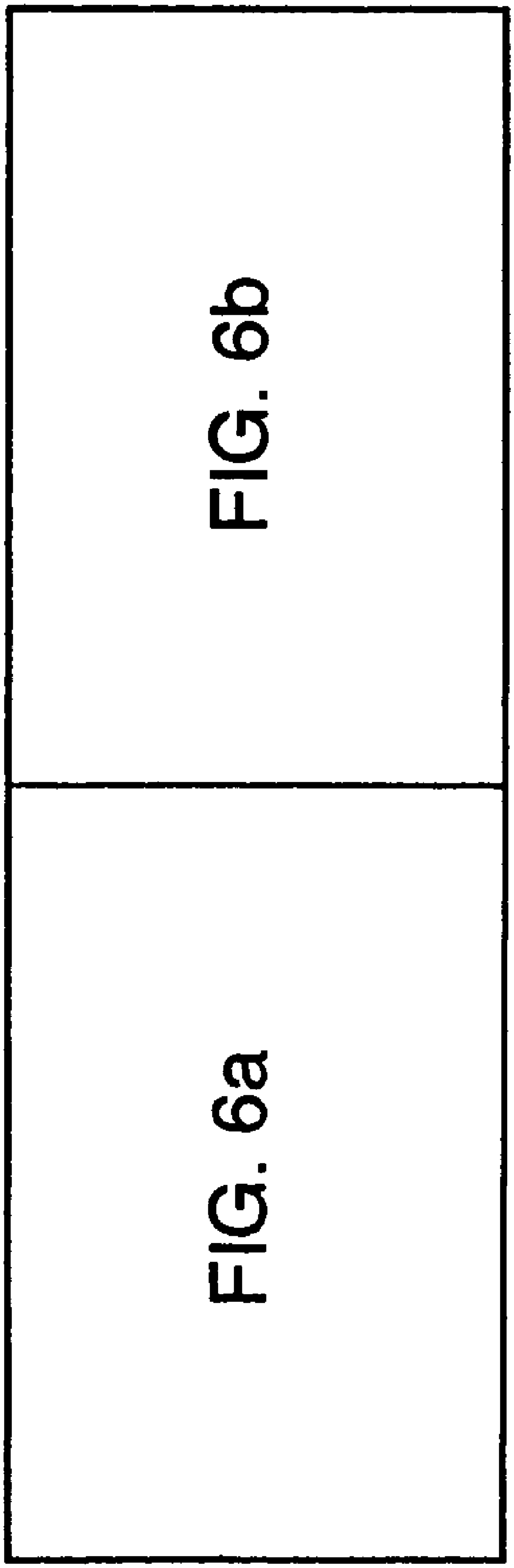
FIG. 5 shows the alignment of FIGS. 6*a* and 6*b* with respect to each other.

FIGS. 6*a* and 6*b*, when aligned as shown in FIG. 5, illustrates the sensor circuit 22 incorporated for detection of the variance of the capacitive sense field located around and about the sensing mat 18. Central to the operation of the sensor circuit 22 is a capacitive monitor circuit 64 which connects as previously described, to the conductive sense electrode 52 and to the conductive ground electrode 56. The capacitive monitor circuit 64 includes the charge-transfer touch integrated circuit 54 and a sampling capacitor 66 incorporated across SNS1 and SNS2 of the charge-transfer touch integrated circuit 54. The value of the sampling capacitor 66 can be changed as required to provide proper sensitivity for a given capacitance across the sensing mat 18 such as between the conductive sense electrode 52 and the conductive ground electrode 56. Resistors 65 and 67 also connect to the charge-transfer touch integrated circuit 54. An RC circuit 68 including a variable capacitor 70 and a resistor 72 is connected to the output of the charge-transfer touch integrated circuit 54 and the base of a switching transistor 74 is connected to the RC circuit 68. The collector and emitter of the switching transistor 74 are connected across the switch terminals, i.e., jacks 42 and 44, which lead to the lane module(s) 28 via the cable 40. A diode 76 connected across Vss and the base of the switching transistor 74 provides a discharge path for the capacitance, protecting the base emitter junction from excessive reverse voltage. A diode 78 across jacks 42 and 44 protects members of the sensor circuit 22 against reversed polarity in the event that the banana plugs 38 are installed reversed.

Preferably, operating power for the sensor circuit 22 is automatically supplied directly from the switch voltage across jacks 42 and 44 where the switch input will have one jack 42 pulled up through a resistor in the lane module 28. Voltage supplied by jack 42 powers a regulated power supply 83 of approximately 2.6 volts, for purpose of example and illustration. As later described in detail, power for the sensor circuit 22 power also can be automatically supplied by a battery circuit 80, which could utilize either a lithium battery 82 or batteries 84 and 86 as supplied. A battery test circuit 87 including a switching transistor 89 and other components, as shown, is also provided and is operated by a test switch 88 which is momentary and illuminates a light emitting diode 90 when a successful test is achieved.

Voltage across the jacks 42 and 44 is sampled by the sensor circuit 22. Low end voltages of lesser value, such value being at least 0.8 volt for purpose of example and illustration, are detected indicating a powered lane module 28 thereby allowing connection of the sensor circuit 22 in general to the lane module 28. If the detected voltage is high enough, power from the jacks 42 and 44 is utilized for powering of the sensor circuit 22. In general, the regulated power supply 83 supplies power and the battery circuit 80 is not utilized for supply power. If the detected voltage is insufficient for operation of the sensor circuit 22, the battery circuit 80 is utilized for powering the sensor circuit 22 in general. If no voltage is detected (no power supplied by the lane module 28), the battery protection circuit 92 completely and automatically disconnects the battery circuit 80 to preserve battery life. The battery protection circuit 92 includes switching transistors 94 and 95, a diode 97, and other components, as shown. Such an automatic feature is useful where manual switching (not provided) the batteries off when the system is not in us is not required, thereby preserving the batteries for future use.

The regulated power supply 83 receives positive operating voltage through the jack 42 and a diode 96. The regulated power supply 83 includes an input filter capacitor 98, a diode 100, resistors 102 and 104, a diode 106, an output filter capacitor 108, and a bypass capacitor 110 which protects the charge-transfer touch integrated circuit 54 from high frequency power supply fluctuations. A Zener diode 111 is also included across the regulated power supply 83 to protect the regulated power supply 83 by limiting the input voltage. Also included in the sensor circuit 22 are programming cables 112*a*-112*n* connected to the charge-transfer touch integrated circuit 54.

Mode of Operation

Reference to FIGS. 6*a*-6*b*, the description thereof, and the following, with occasional reference to other figures, best illustrates the mode of operation of the capacitive relay takeoff swimming platform sensor system 10.

When a swimmer is on the relay takeoff swimming platform 16, the capacitive field about the sensing mat 18, and especially the capacitive field about the region overlying the conductive sense electrode 52, is influenced by the capacitive field of the body of the swimmer and as such is detected and referenced by the charge-transfer touch integrated circuit 54. The output of the charge-transfer touch integrated circuit 54 is low when the swimmer is in physical contact with the sensing mat 18, whereby the capacitive field overlying the conductive sense electrode 52 is at a first level of capacitance. When the swimmer departs the relay takeoff swimming platform 16, the capacitive field about the region overlying the conductive sense electrode 52 is altered and such change in capacitance to a second level is detected. The change in capacitance drives the output of the charge-transfer touch integrated circuit 54 high. The high output of the charge-transfer touch integrated circuit 54 causes the switching transistor 74 to turn on, thereby sinking the switch voltage on jack 42 to ground to signal departure of the swimmer to the lane module 28 and thus signaling the timer 32 where other timer functions also occur for other segments of timing. The resistor 72 and capacitor 70 in the RC circuit 68 form a timing circuit that only allows the switching transistor 74 to stay on for X milliseconds, such time being adjustable by incorporating other capacitive values of the capacitor 70. This "pulse" output is necessary if the sensor circuit 22 is to be powered from the switch voltage supplied to jack 42 by the lane module 28, as previously partially explained. The supply power at the jack 42 will be interrupted whenever the switching transistor 74 turns on to signal a departure, so the diode 96 and capacitor 98 form a charge storage circuit to supply operating voltage to the capacitive monitor circuit 64 to keep the sensor circuit 22 running. Diodes 106 and 97 perform an "OR" of the battery circuit 80 voltage and the regulated power supply 83 voltage where the higher of the two voltages will power capacitive monitor circuit 64 and the sensor circuit 22 in general.

Figure 7:
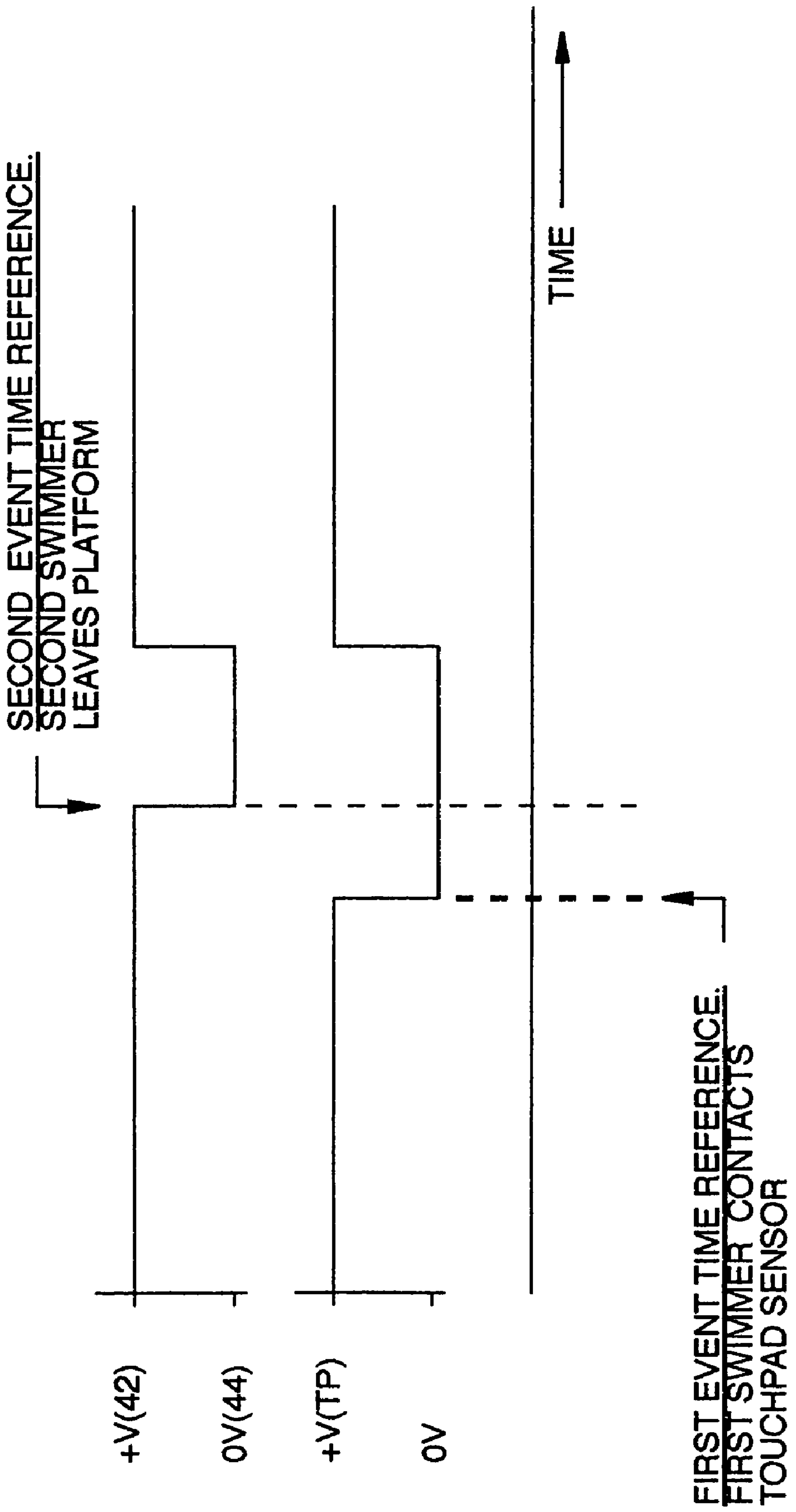
FIG. 7 illustrates a typical time interval and comparison measured by the capacitive relay takeoff swimming platform sensor system; and, FIG. 8 illustrates a time interval and comparison measured by the capacitive relay takeoff swimming platform sensor system where a second swimmer departs early.
Figure 8:
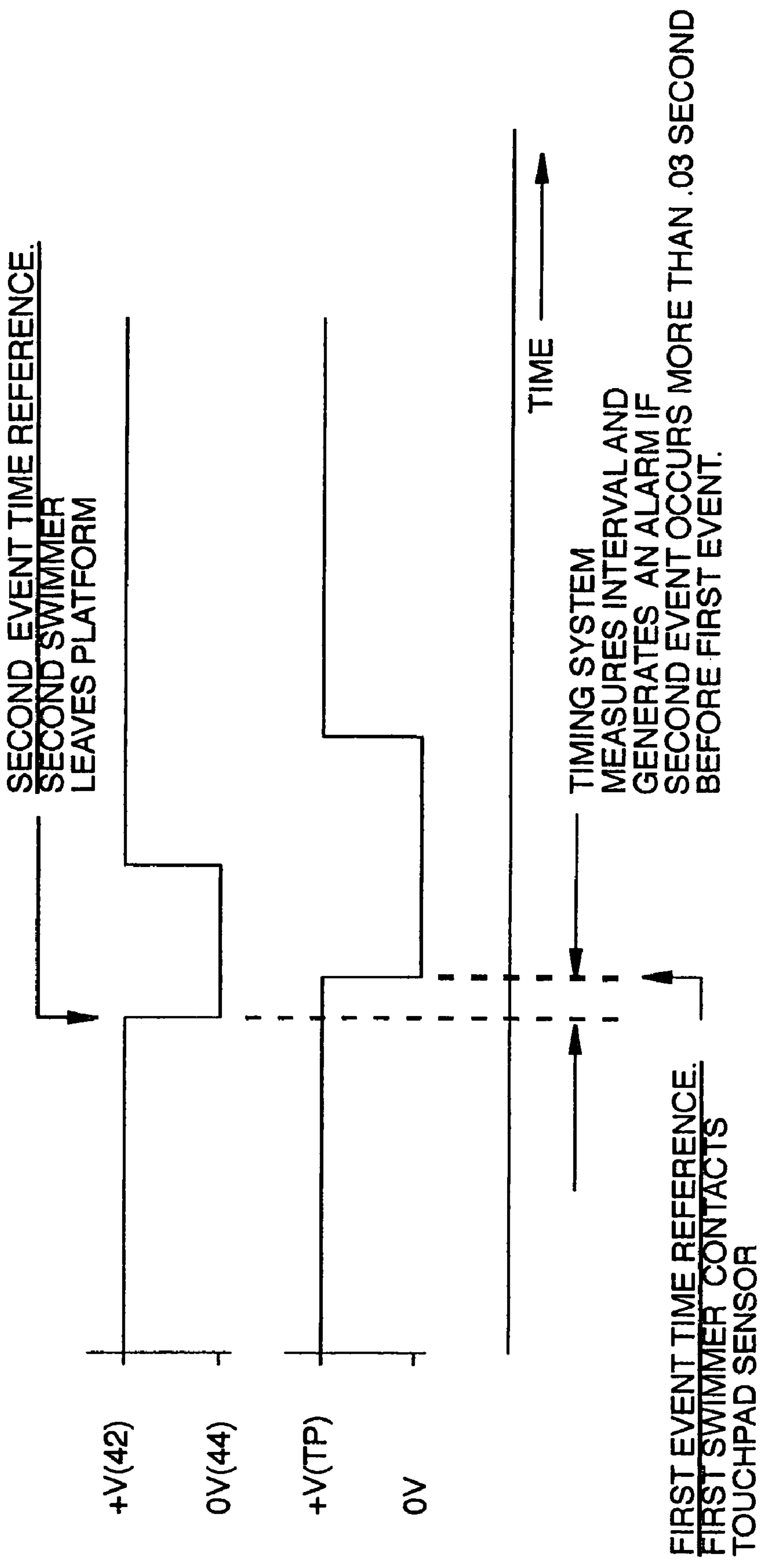

FIGS. 7 and 8 illustrate a time interval comparisons measured by the capacitive relay takeoff swimming platform sensor system 10. A first event time reference is established when a low voltage at the touchpad sensor 26 is detected upon the first swimmer contacting the touchpad sensor 26, and a second event time reference is established when a low voltage across jacks 42 and 44 is detected by the second swimmer leaving the sensing mat 18 on the relay takeoff swimming platform 16. The rules for swimming relays dictate that the first swimmer must touch the touchpad sensor before the second swimmer leaves the relay takeoff swimming platform. Under most circumstances such sequence takes place, and this is illustrated in FIG. 7 where the time reference for the first event (viz., first swimmer contacting touchpad sensor) indicated by a bold dashed line appears before the time reference for the second event (viz., second swimmer leaving platform) denoted by a fainter dashed line. Ideally, and for maximum proficiency, the time references for the first and second events would coincide, and relay teams strive to achieve this ideal. However, occasionally the second event occurs before the first event. When this happens, a disqualification may occur. If the second event time reference occurs prior to the first event time reference, such sequence is noted, and notification thereof can be made visually or aurally by the timer 32 to denote an irregular relay sequence. As previously discussed, a tolerance of 0.03 second in relay exchange timing is acceptable for the purposes of relay event timing. Accordingly, a second swimmer will not be disqualified unless the timing system shows a departure of more than 0.03 second before the first swimmer in the water touches the touchpad sensor 26.

FIG. 8 illustrates an example of the second event occurring prior to the first event. If the time interval indicated by the distance between the faint and bold dashed lines is greater than 0.03 second, an alarm or other signal is given to indicate a disqualification.

Various modifications can be made to the present invention without departing from the apparent scope thereof.

CAPACITIVE RELAY TAKEOFF SWIMMING PLATFORM SENSOR SYSTEM

PARTS LIST

| | |
|---|---|
| 10 | capacitive relay takeoff swimming platform sensor system |
| 12a-n | swimming lane stations |
| 14 | swimming pool |
| 16 | relay takeoff swimming platform |
| 18 | sensing mat |
| 18a | horizontally oriented portion |
| 18b | vertically oriented portion |
| 20 | housing |
| 22 | sensor circuit |
| 24 | touchpad |
| 26 | touchpad sensor |
| 28 | lane module |
| 30 | cable |
| 31 | plugs |
| 32 | timer |
| 34 | start system |
| 36 | scoreboard |
| 38 | banana plug |
| 40 | cable |
| 42 | jack |
| 44 | jack |
| 46 | cable |
| 48 | control buttons |
| 50 | conductive exterior layer |
| 52 | conductive sense electrode |
| 54 | charge-transfer touch integrated circuit |
| 56 | conductive ground electrode |
| 58 | insulator layer |
| 60 | insulator layer |
| 62 | insulator layer |
| 64 | capacitive monitor circuit |
| 65 | resistor |
| 66 | sampling capacitor |
| 67 | resistor |
| 68 | RC circuit |
| 70 | capacitor |
| 72 | resistor |
| 74 | switching transistor |
| 76 | diode |
| 78 | diode |
| 80 | battery circuit |
| 82 | lithium battery |
| 83 | regulated power supply |
| 84 | battery |
| 86 | battery |
| 87 | battery test circuit |
| 88 | test switch |
| 89 | switching transistor |
| 90 | LED |
| 92 | battery protection circuit |
| 94 | switching transistor |
| 95 | switching transistor |

-continued

| CAPACITIVE RELAY TAKEOFF SWIMMING PLATFORM SENSOR SYSTEM PARTS LIST | |
|---|---|
| 96 | diode |
| 97 | diode |
| 98 | input filter capacitor |
| 100 | diode |
| 102 | resistor |
| 104 | resistor |
| 106 | diode |
| 108 | output filter capacitor |
| 110 | bypass capacitor |
| 111 | Zener diode |
| 112a-n | programming cables |

The invention claimed is:

1. A capacitive takeoff swimming sensor system, the system comprising:

a. a sensor mat to capacitively detect the presence of a swimmer, the sensor mat having a conductive exterior layer defining a swimmer occupiable region along the surface of the sensor mat, a conductive sense electrode layer, a conductive ground electrode layer, and first and second insulative layers between the conductive layers and a third insulative layer underlying the conductive ground electrode layer;

b. a sensor circuit, the sensor circuit having a charge-transfer touch integrated circuit in electrical communication with the conductive sense electrode and the conductive ground electrode of the sensor mat for determining a first level where the swimmer occupiable region is unoccupied and a second level where the swimmer occupiable region is occupied;

c. a power supply; and, d. a monitor circuit that determines the takeoff of a swimmer by monitoring the change in capacitance level in the swimmer occupiable region based on the first and second sensor levels.

2. The capacitive takeoff swimming sensor system of claim 1, wherein the sensor mat is situated upon a starting platform.

3. The capacitive takeoff swimming sensor system of claim 2, wherein the starting platform is a relay takeoff swimming platform.

4. The capacitive takeoff swimming sensor system of claim 1, wherein a portion of the swimmer occupiable region of the sensor mat is substantially vertically oriented for physical and capacitive contact with at least a portion of a toe of the swimmer.

5. The capacitive takeoff swimming sensor system of claim 1, wherein a portion of the swimmer occupiable region of the sensor mat is substantially horizontally oriented for physical and capacitive contact with at least a portion of a foot of the swimmer.

6. The capacitive takeoff swimming sensor system of claim 1, wherein a portion of the swimmer occupiable region of the sensor mat is substantially vertically oriented for physical and capacitive contact with at least a portion of a toe of the swimmer and a contiguous portion of the swimmer occupiable region of the sensor mat is substantially horizontally oriented for physical and capacitive contact with at least a portion of a foot of the swimmer.

7. The capacitive takeoff swimming sensor system of claim 1, wherein a portion of the swimmer occupiable region of the sensor mat is substantially vertically oriented for physical and capacitive contact with at least a portion of a toe of the swimmer and another portion of the swimmer occupiable region of the sensor mat, continuous with the vertical portion of the sensor mat, is substantially horizontally oriented for physical and capacitive contact with at least a portion of a foot of the swimmer.

8. The capacitive takeoff swimming sensor system of claim 1, wherein the swimmer occupiable region of the sensor mat has a textured non-slip surface for physical and capacitive contact with the swimmer.

9. The capacitive takeoff swimming sensor system of claim 1, wherein the sensor mat includes multiple layers.

10. The capacitive takeoff swimming sensor system of claim 9, wherein the multiple layers of the sensor mat are bonded.

11. The capacitive takeoff swimming sensor system of claim 10, and wherein the multiple layers of the sensor mat are bonded by adhesive.

12. The capacitive takeoff swimming sensor system of claim 1, wherein the sensor mat is a laminate structure.

13. The capacitive takeoff swimming sensor system of claim 1, wherein the conductive exterior layer includes a textured non-slip surface.

14. The capacitive takeoff swimming sensor system of claim 12, wherein the sensor mat laminate structure can assume a non-planar shape.

15. The capacitive takeoff swimming sensor system of claim 1, wherein the charge-transfer touch integrated circuit is a QT310™ capacitive sensor integrated circuit from QUANTUM RESEARCH GROUP®.

16. The capacitive takeoff swimming sensor system of claim 1, wherein the charge-transfer integrated circuit fosters projection of a capacitive sense field around the conductive sense electrode and into the swimmer occupiable region.

17. The capacitive takeoff swimming sensor system of claim 1, wherein the sensor circuit includes a capacitive monitor circuit connected to the conductive sense electrode layer and the conductive ground electrode layer, the capacitive monitor circuit including a charge-transfer touch integrated circuit and a sampling capacitor.

18. The capacitive takeoff swimming sensor system of claim 17, wherein the sampling capacitor is selected to provide desired sensitivity relative to the capacitance across the swimmer occupiable region of the sensing mat.

19. The capacitive takeoff swimming sensor system of claim 1, wherein the power supply is an approximately 2.6 volt regulated power supply.

20. The capacitive takeoff swimming sensor system of claim 1, wherein the power supply is a battery circuit.

21. The capacitive takeoff swimming sensor system of claim 20, wherein the battery circuit includes a lithium battery.

22. The capacitive takeoff swimming sensor system of claim 1, wherein the power supply includes an approximately 2.6 volt regulated power supply and a battery circuit sampling capacitor is selected to provide desired sensitivity relative to the capacitance across the swimmer occupiable region of the sensing mat.

23. A capacitive takeoff swimming sensor system comprising:

a. a sensor mat;

b. a sensor circuit in electrical communication with the sensor mat;

c. a power supply;

d. wherein the sensor mat, sensor circuit and power supply together detect takeoff of a swimmer from the sensor mat by monitoring change in capacitance level in a swimmer occupiable region along the surface of the sensor mat; and, e. a test circuit including a test switch and a light emitting diode to indicate performance of a successful test.

24. The capacitive takeoff swimming sensor system of claim 1, wherein the power supply includes an approximately 2.6 volt regulated power supply and a battery circuit, the battery circuit supplying power when the voltage from the regulated power supply is detected as insufficient.

25. A capacitive takeoff swimming sensor system comprising:

a. a sensor mat;

b. a sensor circuit in electrical communication with the sensor mat;

c. a power supply, wherein the power supply includes an approximately 2.6 volt regulated power supply and a battery circuit, the battery circuit supplying power when the voltage from the regulated power supply is detected as insufficient;

d. wherein the sensor mat, sensor circuit and power supply together detect takeoff of a swimmer from the sensor mat by monitoring change in capacitance level in a swimmer occupiable region along the surface of the sensor mat; and, e. wherein a test circuit including a test switch and a light emitting diode to indicate performance of a successful test, the test circuit normally being supplied by the battery circuit.

26. The capacitive takeoff swimming sensor system of claim 1, wherein the capacitive takeoff swimming sensor system is one of a plurality of like sensor systems, each of the capacitive takeoff swimming sensor systems of the plurality dedicated to a single individual swimming lane in a multi-laned swimming pool and each providing swimmer takeoff information to an interconnected control system having optional capabilities for timing, relay touchpad previous swimmer lane information, scoreboard display, and starting.

27. A capacitive relay takeoff swimming platform sensor system, the system comprising:

a. a plurality of sensor mats for capacitive takeoff detection stationed and arranged along and at the ends of multiple swimming pool lanes used for timing of relay swimming events, each of the sensor mats of the plurality of sensor mats having a conductive exterior layer defining a swimmer occupiable region along the surface of the sensor mat, a conductive sense electrode layer, a conductive ground electrode layer, and first and second insulative layers between the conductive layers and a third insulative layer underlying the conductive ground electrode layer, and wherein the conductive sense electrode layer and the conductive ground layer are electrically connected to a sensor circuit having a charge-transfer touch integrated circuit for determining a first level where the swimmer occupiable region is unoccupied and a second level where the swimmer occupiable region is occupied and a monitor circuit that determines the takeoff of a swimmer by monitoring the change in capacitance level in the swimmer occupiable region based on the first and second sensor levels; and, b. means for comparing timing from the plurality of sensor mats for takeoff detection to electronically detect false starts by second and subsequent swimmers in each lane based upon capacitive changes resulting from takeoff.

28. The capacitive relay takeoff swimming platform sensor system of claim 27, wherein the takeoff detection is substantially pressure insensitive.

29. A capacitive relay takeoff swimming platform sensor system, the system comprising:

a. at least one swimming lane station having a relay takeoff swimming platform, the at least one swimming lane station including:

(1) a sensing mat on the relay takeoff swimming platform to capacitively detect the presence of a swimmer, the sensing mat having a conductive exterior layer defining a swimmer occupiable region along the surface of the sensing mat, a conductive sense electrode layer, a conductive ground electrode layer, and first and second insulative layers between the conductive layers and a third insulative layer underlying the conductive ground electrode layer;

(2) a sensor circuit closely located to the sensing mat, the sensor circuit having a charge-transfer touch integrated circuit in electrical communication with the conductive sense electrode and the conductive ground electrode of the sensing mat for determining a first level where the swimmer occupiable region is unoccupied and a second level where the swimmer occupiable region is occupied and a monitor circuit that determines the takeoff of a swimmer by monitoring the change in capacitance level in the swimmer occupiable region based on the first and second sensor levels;

(3) a cable connecting the sensor circuit to a lane module; and, (4) a touchpad including a touchpad sensor mounted on the swimming pool at the lane end being connected to the lane module by another cable; and, b. a timer connected to the lane module by yet another cable.

30. The capacitive relay takeoff swimming platform sensor system of claim 29, wherein the timer is connected to a start system.

31. The capacitive relay takeoff swimming platform sensor system of claim 29, wherein the timer is connected to a scoreboard.

32. The capacitive relay takeoff swimming platform sensor system of claim 29, wherein the lane module receives timing information when a contact is detected at the touchpad sensor and wherein the lane module receives timing information when a takeoff is detected at the sensing mat.

33. The capacitive relay takeoff swimming platform sensor system of claim 32, wherein the timing of the detected contact and the detected takeoff are compared against a pre-set disqualification criterion.

34. The capacitive relay takeoff swimming platform sensor system of claim 33, wherein the pre-set disqualification criterion is a detected takeoff preceding a detected contact by 0.03 second.

35. The capacitive relay takeoff swimming platform sensor system of claim 33, wherein the satisfaction of the pre-set disqualification criterion results in generation of an alarm signal.

36. The capacitive relay takeoff swimming platform sensor system of claim 33, wherein the at least one swimming lane station having a relay takeoff swimming platform, is one of a plurality of swimming lane stations, all electrically communicating with the timer and are employed for conducting starts and finishes at each swimming lane station and for analyzing data at the relay takeoff swimming platforms with respect to the arrivals of first relay swimmers at the pool edges and the departures of second relay swimmers at the relay takeoff swimming platforms.

37. The capacitive relay takeoff swimming platform sensor system of claim 33, further comprising a scoreboard connected as part of the system to annunciate swimming event elapsed times or other data as desired.

38. A method of timing swimming relays, the method comprising the steps of:

a. providing a swimming lane station with a sensing mat, the sensing mat having a conductive exterior layer defining a swimmer occupiable region along the surface of the sensing mat, a conductive sense electrode layer, a conductive ground electrode layer, and first and second insulative layers between the conductive layers and a third insulative layer underlying the conductive ground electrode layer and insulating the sensing mat from the swimming lane station, and wherein the conductive sense electrode layer and the conductive ground layer are electrically connected to a sensor circuit having a charge-transfer touch integrated circuit for determining a first level where the swimmer occupiable region is unoccupied and a second level where the swimmer occupiable region is occupied and a monitor circuit that determines the takeoff of a swimmer by monitoring the change in capacitance level in the swimmer occupiable region based on the first and second sensor levels and a touchpad sensor at a lane end associated with the swimming lane station;

b. sensing arrival of a first relay swimmer by contact with the touchpad sensor mounted on the associated swimming pool lane end; and, c. sensing departure of a second relay swimmer from the relay takeoff swimming platform by the sensing mat and the sensor circuit and the monitor circuit.

39. The method of claim 38, wherein sensing the second relay swimmer departure is includes sensing a capacitance level change at the sensing mat.

40. The method of claim 39, wherein an integrated circuit is incorporated with adjoining circuitry contained in a housing mounted adjacent to one edge of the sensing mat to sense the capacitance level and the influence thereof adjoining the upper region of the sensing mat.

41. The method of claim 40, wherein the sensing mat is constructed of multiple layers, the layers including protective layers, electrically insulative layers, and electrically conductive layers which are opposed and form sensor electrodes.

42. The method of claim 41, wherein a sensor electrode is incorporated to monitor the capacitance of the region at the upper region of the sensing mat.

43. The method of claim 42, wherein monitored capacitance is varied by the departure of the second relay swimmer from the relay takeoff swimming platform, and such capacitance variation is detected by the integrated circuit to denote and relay the departure of the second relay swimmer.

44. The method of claim 43, further comprising the step of electronically closing a switch to compare the departure time of the second relay swimmer to the arrival time of the first relay swimmer by the connected timer.

* * * * *